US012593615B2

(12) United States Patent
Dutta et al.

(10) Patent No.: US 12,593,615 B2
(45) Date of Patent: Mar. 31, 2026

(54) MRAM DEVICE WITH WRAP-AROUND TOP ELECTRODE CONTACT

(71) Applicant: INTERNATIONAL BUSINESS MACHINES CORPORATION, Armonk, NY (US)

(72) Inventors: Ashim Dutta, Clifton Park, NY (US); Shravana Kumar Katakam, Lehi, UT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 696 days.

(21) Appl. No.: 18/065,651

(22) Filed: Dec. 14, 2022

(65) Prior Publication Data

US 2024/0206345 A1 Jun. 20, 2024

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ........ H10N 50/80; H10N 50/01; H10N 50/10; H10B 61/00
See application file for complete search history.

(56) References Cited

U.S. PATENT DOCUMENTS

| | | | |
|---|---|---|---|
| 9,343,659 B1 | 5/2016 | Lu | |
| 9,401,309 B2 | 7/2016 | Izumi | |
| 9,406,875 B2 | 8/2016 | Li | |
| 9,972,775 B2 | 5/2018 | Shum | |
| 10,199,572 B2 | 2/2019 | Yi | |
| 10,483,461 B2 | 11/2019 | Yi et al. | |
| 10,693,054 B2 | 6/2020 | Shum et al. | |

(Continued)

FOREIGN PATENT DOCUMENTS

| | | |
|---|---|---|
| CN | 110915011 A | 3/2020 |
| EP | 3440719 A1 | 2/2019 |

(Continued)

OTHER PUBLICATIONS

Edelstein et al., "A 14 nm Embedded STT-MRAM CMOS Technology", Conference Paper, Dec. 2020, 5 pages.

(Continued)

*Primary Examiner* — Shih Tsun A Chou
(74) *Attorney, Agent, or Firm* — L. Jeffrey Kelly

(57) ABSTRACT

A magnetic tunnel junction (MTJ) stack, and a metallic encapsulation layer surrounding vertical side surfaces of the MTJ stack, electrically and physically connected to a top electrode of the MTJ stack. A magnetic tunnel junction (MTJ) stack, and a metallic encapsulation layer surrounding vertical side surfaces of the MTJ stack, electrically and physically connected to a top electrode of the MTJ stack, where a lower horizontal surface of the metallic encapsulation layer is below a bottom electrode contact of the MTJ stack. Forming a magnetic tunnel junction (MTJ) stack and forming a metallic encapsulation layer surrounding vertical side surfaces of the MTJ stack, electrically and physically connected to a top electrode of the MTJ stack.

17 Claims, 11 Drawing Sheets

(56) References Cited

U.S. PATENT DOCUMENTS

| | | | |
|---|---|---|---|
| 11,088,320 B2 | 8/2021 | Yang | |
| 11,944,013 B2 | 3/2024 | Wu et al. | |
| 11,980,039 B2 | 5/2024 | Marchack et al. | |
| 12,207,561 B2 | 1/2025 | Katakam et al. | |
| 2013/0119494 A1 | 5/2013 | Li | |
| 2016/0329488 A1 | 11/2016 | Li et al. | |
| 2016/0365505 A1 | 12/2016 | Lu | |
| 2019/0259762 A1* | 8/2019 | Chou | H10N 50/80 |
| 2020/0098978 A1 | 3/2020 | Liao et al. | |
| 2020/0321394 A1 | 10/2020 | Hashemi | |
| 2020/0350495 A1* | 11/2020 | Dutta | H10N 50/80 |
| 2021/0151503 A1 | 5/2021 | Hashemi et al. | |
| 2021/0242399 A1 | 8/2021 | Lee et al. | |
| 2022/0044717 A1 | 2/2022 | Huang et al. | |
| 2022/0149271 A1 | 5/2022 | Aggarwal et al. | |
| 2022/0223649 A1 | 7/2022 | Wan et al. | |

FOREIGN PATENT DOCUMENTS

| | | | |
|---|---|---|---|
| TW | 202101458 A | 1/2021 | |
| TW | 202207378 A | 2/2022 | |
| TW | I841394 B | 5/2024 | |
| TW | I841398 B | 5/2024 | |
| WO | 2010019887 A1 | 2/2010 | |
| WO | 2017/171716 A1 | 10/2017 | |

OTHER PUBLICATIONS

Zhao et al., "Embedded MRAM for High-speed Computing", 2011 IEEE/IFIP 19th International Conference on VLSI and System-on-Chip, Accessed on Jun. 13, 2022, 8 pages.

Pending U.S. Appl. No. 18/061,491, filed Dec. 5, 2022, entitled: "Mram Device With Wrap-Around Top Electrode", 37 pages.

United States Non-Final Rejection dated Jul. 24, 2024, 8 pages, in U.S. Appl. No. 18/061,491.

* cited by examiner

MRAM DEVICE WITH WRAP-AROUND TOP ELECTRODE CONTACT

BACKGROUND

The present invention relates, generally, to the field of semiconductor manufacturing, and more particularly to fabricating a magnetic tunnel junction device with a wrap-around top electrode contact.

Magneto resistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

SUMMARY

According to an embodiment of the present invention, a semiconductor device is provided. The semiconductor device including a magnetic tunnel junction (MTJ) stack, and a metallic encapsulation layer surrounding vertical side surfaces of the MTJ stack, electrically and physically connected to a top electrode of the MTJ stack. Where a lower horizontal surface of the metallic encapsulation layer is below a bottom electrode of the MTJ stack. Further including a dielectric encapsulation layer surrounding vertical side surfaces of the MTJ stack, where the metallic encapsulation layer surrounds the dielectric encapsulation layer. Where the MTJ stack includes a top electrode, a free layer, a tunneling barrier and a reference layer. Where an upper word line of the MTJ stack includes an upper horizontal surface below a lower horizontal surface of the top electrode. Where an upper word line of the MTJ stack includes an upper horizontal surface below a lower horizontal surface of the bottom electrode.

According to an embodiment of the present invention, a semiconductor device is provided. The semiconductor device including a magnetic tunnel junction (MTJ) stack, and a metallic encapsulation layer surrounding vertical side surfaces of the MTJ stack, electrically and physically connected to a top electrode of the MTJ stack, where a lower horizontal surface of the metallic encapsulation layer is below a bottom electrode contact of the MTJ stack. Further including a dielectric encapsulation layer surrounding vertical side surfaces of the MTJ stack, where the metallic encapsulation layer surrounds the dielectric encapsulation layer. Where the MTJ stack includes a top electrode, a free layer, a tunneling barrier and a reference layer. Where an upper word line of the MTJ stack includes an upper horizontal surface below a lower horizontal surface of the top electrode.

According to an embodiment of the present invention, a method is provided. The method including forming a forming a magnetic tunnel junction (MTJ) stack and forming a metallic encapsulation layer surrounding vertical side surfaces of the MTJ stack, electrically and physically connected to a top electrode of the MTJ stack. Where a lower horizontal surface of the metallic encapsulation layer is below a bottom electrode of the MTJ stack. Further including forming a dielectric encapsulation layer surrounding vertical side surfaces of the MTJ stack, wherein the metallic encapsulation layer surrounds the dielectric encapsulation layer. Where the MTJ stack includes a top electrode, a free layer, a tunneling barrier and a reference layer. Where an upper word line of the MTJ stack includes an upper horizontal surface below a lower horizontal surface of the top electrode. Where an upper word line of the MTJ stack includes an upper horizontal surface below a lower horizontal surface of the bottom electrode. Further including forming a dielectric surrounding the MTJ stack. Further including forming an upper word line of the MTJ stack, wherein the upper word line surrounds vertical size surfaces of the MTJ stack. Further including removing a portion of the upper word line. Further including forming an inter-layer dielectric above the upper word line surrounding exposed portions of the metallic encapsulation layer.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
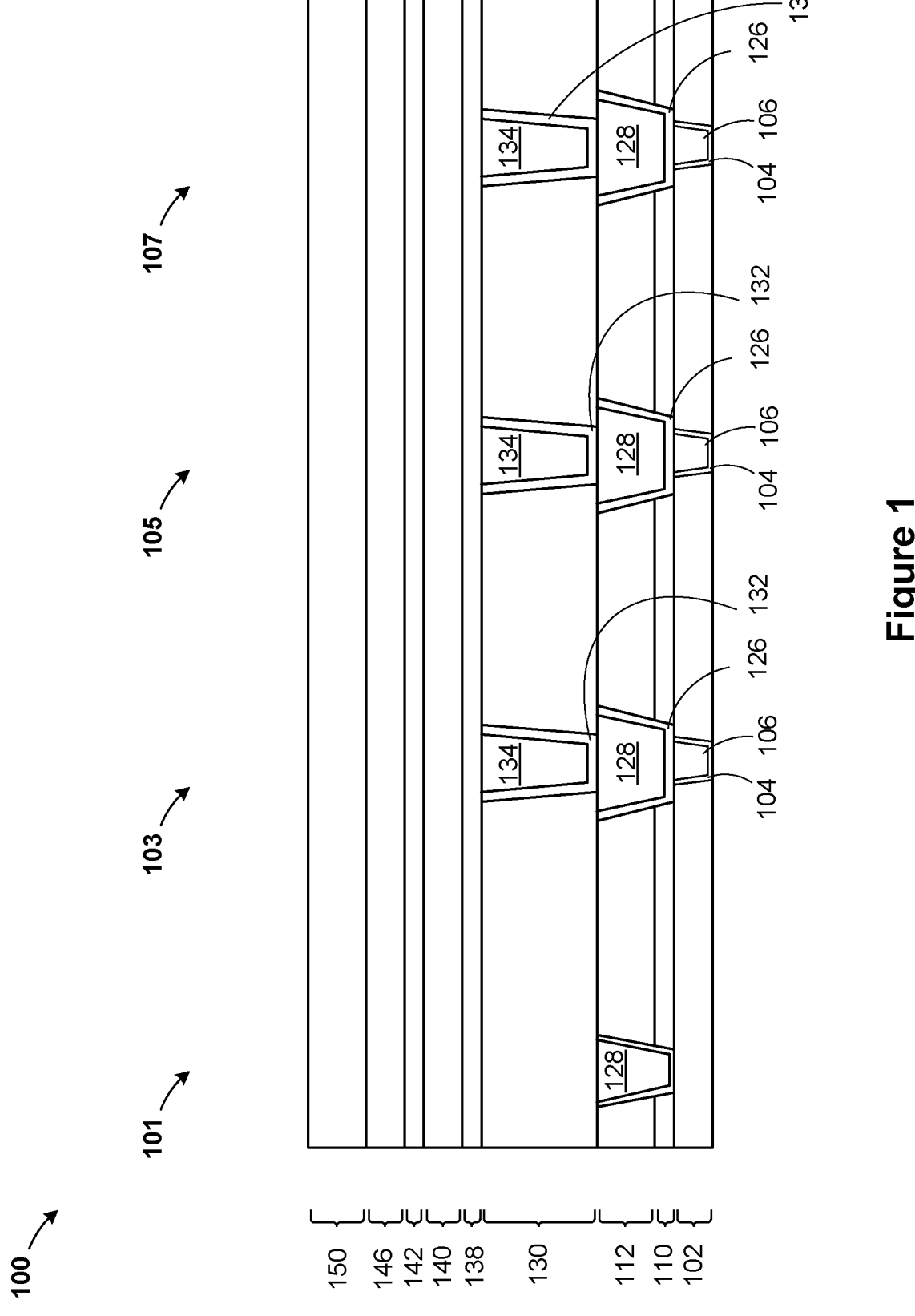
FIG. 1 illustrates a cross-sectional view of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magneto resistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet, or a reference layer, set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher when the magnetizations are anti-parallel and lower when they are parallel, though this can be reversed, depending on materials used in fabrication of the MRAM.

The MRAM stack layers may be conformally formed using known techniques. In formation of the MTJ stacks layers, a metallic bottom electrode layer is deposited on top of a bottom electrode contact followed by the MTJ stack (including a reference layer, covered by a tunnelling barrier layer, which is covered by a free layer). This is followed by deposition of a top electrode. In an embodiment, the tunneling barrier layer is a barrier, such as a thin insulating layer or electric potential, between two electrically conducting materials. Electrons (or quasiparticles) pass through the tunneling barrier layer by the process of quantum tunneling. In certain embodiments, the tunneling barrier layer includes at least one sublayer composed of magnesium oxide (MgO). It should be appreciated that materials other than MgO can be used to form the tunneling barrier layer. The free layer is a magnetic free layer that is adjacent to tunneling barrier layer and on a opposite side of the reference layer. The free layer has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

For high performance MRAM devices based on perpendicular magnetic tunnel junction (MTJ) structures, well-defined interfaces and interface control are essential. MTJ structures typically include a cobalt (Co) based synthetic anti-ferromagnet (SAF), a CoFeB-based reference layer, a MgO-based tunnel barrier, a CoFeB-based free layer, and cap layers containing e.g. tantalum (Ta) and/or ruthenium (Ru). Embedded MTJ structures are usually formed by subtractive patterning of blanket MTJ stacks into pillars between two metal levels.

The MRAM structure includes an MRAM pillar plus the bottom electrode contact. The MRAM pillar includes a bottom electrode, a top electrode, and layers in between, including the reference layer, the tunneling barrier and the free layer. The MRAM structure height includes a height of a top electrode of the MRAM pillar, a height of the MTJ stack of the MRAM pillar, a height of a bottom electrode, and a height of a bottom electrode contact of the MRAM pillar.

A current MRAM structure has height equal to Vx via height plus an Mx+1 line height. An Mx line is an interconnect metal line, for example, a word line, which is below the MRAM structure. An Mx+1 line is an interconnect metal line, for example, a bit line, which is above the MRAM structure. The Mx+1 line height is a vertical depth of the interconnect metal level that is in contact with a top electrode of the MRAM structure. The Vx via connects the Mx line and the Mx+1 interconnect metal lines.

The current MRAM structure limits the depth of Mx+1 lines and increases Vx via aspect ratio. In general, the aspect ratio of the Vx via is a measure of the depth of the Vx via compared to its hole diameter. Mathematically this is a height of the Vx via divided by a critical dimension (CD) of the Vx via. In this case, the aspect ratio is a ratio between Vx via height and the top CD of the Vx via. For example, a conventional MRAM may have an AR between 1:1 to 1:2. It is advantageous to decrease the aspect ratio (AR) because decreasing the AR reduces a complexity of patterning. A relatively higher AR increases voiding, for example copper voiding, during metal fill of the Vx via, which is a reliability concern.

A traditional MRAM structure limits Mx+1 trench depth to a depth of an MRAM top electrode to avoid excessive erosion of the encapsulation which would lead to MTJ/device shorts. This results in Vx aspect ratio increase beyond the acceptable limit of void free metal fill, for example, copper fill. This limits the fitting of MRAM into narrow intermetal dielectric spacing (between the Mx line and the Mx+1 line) thus making it difficult for usage of MRAM in advanced nodes of 14 nm logic and beyond. Increasing the Mx+1 line depth below bottom of top electrode will result in possible shorts within the MTJ stack due to erosion of the encapsulation material (pink dielectric).

The traditional MRAM structure limits a total height of the MRAM pillar, including the bottom electrode contact, which cannot be shorter than a combined Vx via height plus the Mx+1 line height. Additionally, the Mx+1 line directly contacts the top electrode of the MRAM.

This invention describes a new structure of MRAM, including a bottom electrode contact, with a total height which is greater than a combined Vx via height and Mx+1 line height. The Mx+1 line contacts the top electrode of the MRAM through a metallic spacer which wraps around a dielectric encapsulation of the MRAM device. The new MRAM structure has total height of the MRAM structure, including a height of the bottom electrode contact, which is greater than the combined Vx via height and the Mx+1 line height.

In this invention, the MRAM pillar is formed and then encapsulated by a dielectric. The dielectric encapsulation is then etched back to expose a portion of the top electrode of the MRAM pillar. The dielectric encapsulated MRAM pillar is then encapsulated by a metallic spacer. The metallic spacer deposition is etched back to remove all the metallic metal deposition between adjacent MRAM pillars to isolate adjacent MRAM pillars. The Mx+1 line metallization is subsequently formed using conventional metallization processes which includes metal deposition and chemical mechanical planarization process to fill the metal to a same height as the top electrode of MRAM pillar. The metallic material of the Mx+1 line is then partially recessed selective to the metallic spacer encapsulating the MRAM pillar to reduce it to a height below the MRAM structure height. The remaining metallic material of the Mx+1 line is capped using with an interlayer dielectric which also surrounds exposed portions of the metallic spacer encapsulating the MRAM pillar.

This invention enables fitting of a taller MRAM pillar into narrow intermetal dielectric spacing, extending sage of MRAM into more advanced node technologies. The new structure has total height of the MRAM, including a bottom electrode contact, which is a greater height than combined height of the Vx via and the Mx+1 line. Top metal Mx+1 contacts MRAM top electrode through a metallic spacer that wraps around the dielectric encapsulation of MRAM device.

This invention describes a structure with the MRAM device embedded into an Mx+1 metal line itself, and the MRAM device extending to a height above an upper surface of the Mx+1 metal line. The new structure has an upper electrode contact which wraps around the MRAM structure. The Mx+1 line contacts the wrap around upper electrode contact at a height below an upper surface of the MRAM device. In an embodiment, an upper surface of the Mx+1 line can be below a lower surface of the bottom electrode contact.

The present invention relates, generally, to the field of semiconductor manufacturing, and more particularly to fabricating a magnetic tunnel junction device with a wrap-around upper electrode contact.

Referring now to FIG. 1, a semiconductor structure 100 (hereinafter "structure") at an intermediate stage of fabrication is shown according to an exemplary embodiment. FIG. 1 is a cross-sectional view of the structure 100. The structure 100 may be formed or provided. The structure 100 may include a cell 101, a cell 103, a cell 105 and a cell 107. The cells 101, 103, 105, 107 each include, for example, an inter-layer dielectric (hereinafter "ILD") 102, a cap 110, an inter-layer dielectric (hereinafter "ILD") 112, a liner 126, a lower metal wire 128 and an inter-layer dielectric (hereinafter "ILD") 130.

The cells 103, 105, 107 each include, for example, a liner 132 and a bottom electrode contact 134. The cell 101 does not include, for example, the liner 132 and the bottom electrode contact 134.

The cells 101, 103, 105, 107 each include, for example, a bottom electrode 138, a reference layer 140, a tunneling barrier 142, a free layer 146 and a top electrode 150.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer.

The ILD 102 may be formed by depositing or growing a dielectric material on the BEOL layers, followed by a chemical mechanical polishing (CMP) or etch steps. The ILD 102 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 102 may include one or more layers. In an embodiment, the ILD 102 may include any dielectric material such as tetraethyl orthosilicate (TEOS), silicon oxide (SiOx), silicon nitride (SiNx), silicon boron carbonitride (SiBCN), NBLOK, a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

The via 106 may be formed by first patterning three or more trenches (not shown) into the ILD 102, lining the three or more trenches with the via liner 104, and filling the three or more trenches. The via liner 104 separates the conductive interconnect material of the via 106 from the ILD 102. The via liner 104 may be composed of, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and other high melting point metals or conductive metal nitrides, or a combination thereof. The via liner 104 may be deposited utilizing a conventional deposition process such as, for example, CVD, plasma enhanced chemical vapor deposition (PECVD), PVD or ALD. The via liner 104 may be 5 nm thick, although a thickness less than or greater than 5 nm may be acceptable. The via liner 104 surrounds a lower horizontal surface and a vertical side surface of the via 106.

In an embodiment, the via 106 is formed from a conductive material layer which is blanket deposited on top of the structure 100, and directly on an upper horizontal surface of the via liner 104, filling the three or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The via 106 is formed by damascene, or patterned from the conductive material layer, using known patterning and etching techniques. There may be any number of openings in the ILD 102, each filled with the via liner 104 and the via 106, on the structure 100.

A planarization process, such as, for example, chemical mechanical polishing (CMP), may be done to remove excess material from an upper horizontal surface of the structure 100 such that upper horizontal surfaces of the via 106, the via liner 104 and the ILD 102 are coplanar. In an embodiment, the via 106 may have a thickness ranging from about 50-200 nm, although a thickness less than 50 nm and greater than 200 nm may be acceptable.

The cap 110 may be formed conformally on the ILD 102, the via 106 and the via liner 104, followed by a chemical mechanical polishing (CMP) or etch steps. The cap 110 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the cap 110 may include one or more layers. In an embodiment, the cap 110 may include any dielectric material such as NBLOK, silicon oxide (SiOx), silicon nitride (SiNx), silicon boron carbonitride (SiBCN), a low-k dielectric material (with k<4.0), including but not limited to, silicon oxide, spin-on-glass, a flowable oxide, a high-density plasma oxide, borophosphosilicate glass (BPSG), or any combination thereof or any other suitable dielectric material. A thickness of the cap 110 may be between 10 nm and 100 nm. The cap 110 may act as a diffusion barrier coating for the metal fill in the via 106.

The ILD 112 may be formed by depositing or growing a dielectric material on the cap 110, followed by a chemical mechanical polishing (CMP) or etch steps. The ILD 112 may be formed as described for the ILD 102.

The lower metal wire 128 may be formed by first patterning four or more trenches (not shown) into the ILD 112 and into the cap 110, exposing an upper surface of the via 106 in the cells 103, 105, 107, lining the four or more trenches with the liner 126 and filling the four or more trenches. The liner 126 separates the conductive interconnect material of the lower metal wire 128 from the ILD 112. The liner 126 may be composed of, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and other high melting point metals or conductive metal nitrides, or a combination thereof. The liner 126 may be deposited utilizing a conventional deposition process such as, for example, CVD, plasma enhanced chemical vapor deposition (PECVD), PVD or ALD. The liner 126 may be 5 nm thick, although a thickness less than or greater than 5 nm may be acceptable. The liner 126 surrounds a lower horizontal surface and a vertical side surface of the lower metal wire 128.

In an embodiment, the lower metal wire 128 is formed from a conductive material layer which is blanket deposited on top of the structure 100, and directly on an upper horizontal surface of the liner 126, filling the four or more trenches (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The lower metal wire 108 is formed by damascene, or patterned from the conductive material layer, using known patterning and etching techniques. There may be any number of openings in the ILD 112, each filled with the liner 126 and the lower metal wire 128, on the structure 100.

A planarization process, such as, for example, chemical mechanical polishing (CMP), may be done to remove excess material from an upper horizontal surface of the structure 100 such that upper horizontal surfaces of the lower metal wire 128, the liner 126 and the ILD 112 are coplanar. In an embodiment, the lower metal wire 128 may have a thickness ranging from about 10 nm to about 200 nm, although a thickness less than 10 nm and greater than 200 nm may be acceptable.

The ILD 130 may be formed as described for the ILD 102, directly on an upper horizontal surface of the liner 126, the lower metal wire 128 and the ILD 112.

The bottom electrode contact 134 may be formed by first patterning three or more via openings (not shown) into the ILD 130, lining the three or more via openings with the liner 132, and filling the three or more via openings. The liner 132 separates the conductive interconnect material of the lower bottom electrode contact 134 from the ILD 130. The liner 132 may be formed as described for the liner 126. The liner 132 surrounds a lower horizontal surface and a vertical side surface of the lower bottom electrode contact 134.

In an embodiment, the bottom electrode contact 134 is formed from a conductive material layer which is blanket deposited on top of the structure 100, and directly on an upper horizontal surface of the liner 132, filling the three or more via openings (not shown). The conductive material layer may include materials such as, for example copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof. The bottom electrode contact 134 is formed by damascene, or patterned from the conductive material layer, using known patterning and etching techniques. There may be any number of via openings in the ILD 130, each filled with the liner 132 and the bottom electrode contact 134 on the structure 100.

A planarization process, such as, for example, chemical mechanical polishing (CMP), may be done to remove excess material from an upper horizontal surface of the structure 100 such that upper horizontal surfaces of the bottom electrode contact 134, the liner 132 and the ILD 130 are coplanar. In an embodiment, the bottom electrode contact 134 may have a thickness ranging from about 10 nm to about 50 to 150 nm, although a thickness less than 50 nm and greater than 150 nm may be acceptable.

The bottom electrode 138 may be blanket deposited on top of the structure 100, and directly on an upper horizontal surface of the bottom electrode contact 134 and the liner 132. The conductive material layer may include materials such as, for example tantalum nitride (TaN), titanium nitride (TiN), and other common hard mask materials or a combination of them. The conductive material layer may be a conductive film which acts as a bottom electrode and also as a diffusion barrier for the bottom electrode contact 134. The bottom electrode 138 can be formed by for example, chemical vapor deposition (CVD), physical vapor deposition (PVD), and atomic layer deposition (ALD) or a combination thereof.

A planarization process, such as, for example, chemical mechanical polishing (CMP), may be done to remove excess material from an upper horizontal surface of the structure 100 such that upper horizontal surfaces of the bottom electrode 138 are coplanar.

The reference layer 140 may be formed conformally on the structure 100, on an upper horizontal surface of the bottom electrode 138. The tunneling barrier 142 may be formed conformally on an upper horizontal surface of the reference layer 140. The free layer 146 may be formed conformally on an upper horizontal surface of the tunneling barrier 142.

The top electrode 150 is formed from a conductive material layer which is blanket deposited on top of the structure 100, and directly on an upper horizontal surface of the free layer 146. The top electrode 150 may be composed of, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and other high melting point metals or conductive metal nitrides, or a combination thereof. The top electrode 150 may be deposited utilizing a conventional deposition process such as, for example, CVD, plasma enhanced chemical vapor deposition (PECVD), PVD or ALD. The top electrode may have a thickness ranging from about 10 nm to about 100 nm, although a thickness less than 10 nm and greater than 100 nm may be acceptable.

Figure 2:
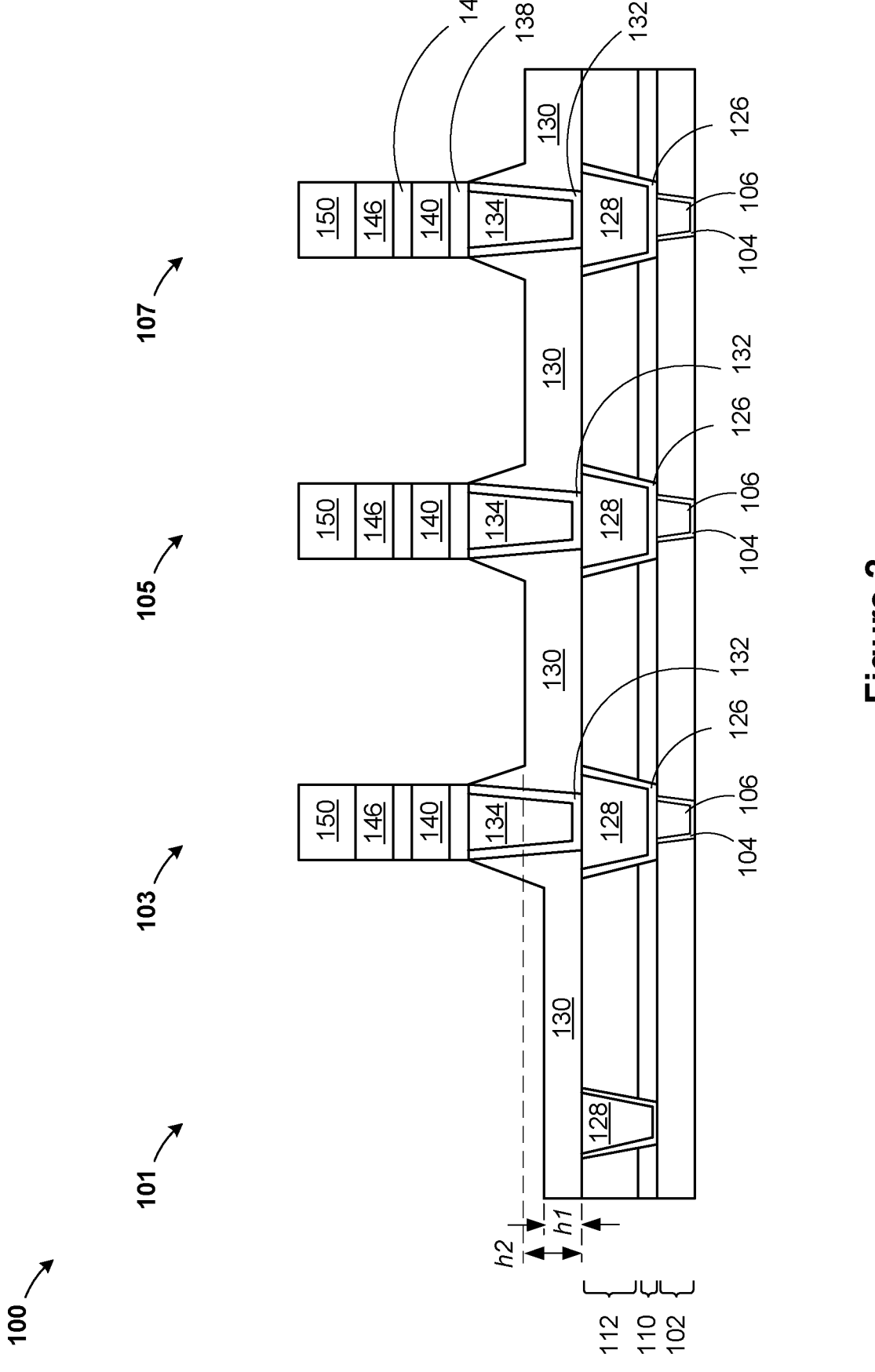
FIG. 2 illustrates a cross-sectional view of the semiconductor structure and illustrates separation into more than one multi-state memory cell, according to an exemplary embodiment.

Referring now to FIG. 2, a cross-sectional view of the structure 100 is shown, according to an embodiment. Patterning may be done to separate the cells 101, 103, 105, 107.

A mask (not shown) may be formed on the structure 100, on the top electrode 150 to provide patterning. Selective removal of portions of layers of the structure 100 may be done using a combination of reactive ion etching (RIE) and ion beam etching (IBE). The mask (not shown) may be removed after patterning.

Vertically aligned portions of the top electrode 150, the free layer 146, the tunneling barrier 142, the reference layer 140 and the bottom electrode 138 may be removed. Portions of the ILD 130 may be removed. Remaining portions of the top electrode 150, the free layer 146, the tunneling barrier 142, the reference layer 140 and the bottom electrode 138 may each remain vertically aligned above the bottom electrode contact 134, the lower metal wire 128 and the via 106. The vertically aligned layers of the top electrode 150, the free layer 146, the tunneling barrier 142, the reference layer 140, the bottom electrode 138 and the bottom electrode contact 134, each form an MRAM structure in the cells 103, 105, 107. The top electrode 150, the free layer 146, the tunneling barrier 142, the reference layer 140, the bottom electrode 138, and portions of the ILD 130 may be removed in the cell 101. The cell 101 does not contain an MRAM structure, nor does the cell 101 contain a via 106.

Portions of the ILD 130 may be removed. Remaining portions of the ILD 130 may surround vertical side surfaces of the liner 132 surrounding the bottom electrode contact 134. Remaining portions of the ILD 130 may cover a horizontal upper horizontal surface of the ILD 112, the lower metal wire 128 and the liner 126. The ILD 130 may have a vertical side surface surrounding the bottom electrode contact 134 which is slanted such that it slopes away from an upper horizontal surface of the bottom electrode contact 134, in the cells 103, 105, 107.

A height, h1, of the ILD 130 above the ILD 112 in the cell 101 may be less than a height, h2, of the ILD 130 between the cells 103, 105 and between the cells 105, 107.

Figure 3:
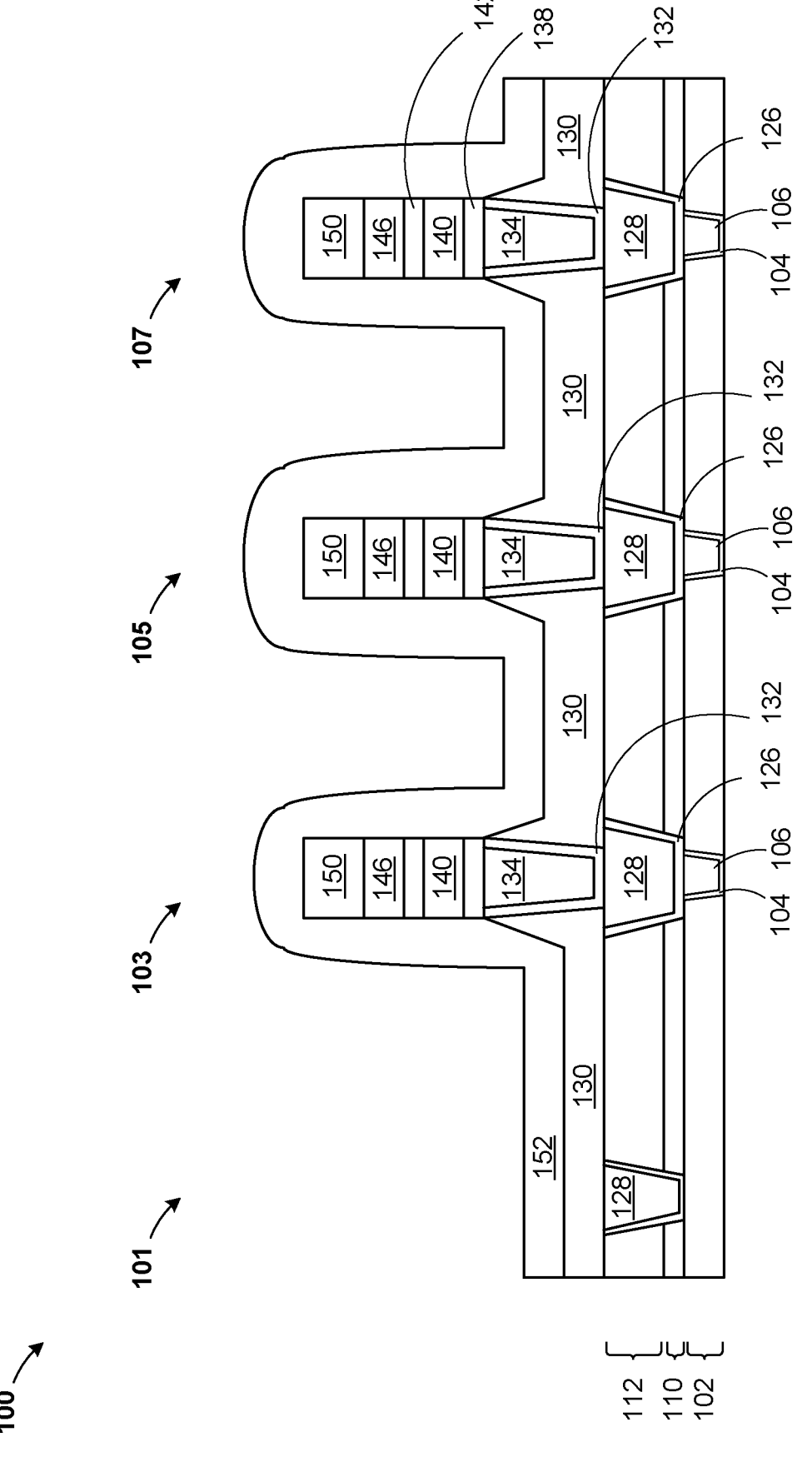
FIG. 3 illustrates a cross-sectional view of the semiconductor structure and illustrates formation of a dielectric encapsulation layer, according to an exemplary embodiment.

Referring now to FIG. 3, a cross-sectional view of the structure 100 is shown, according to an embodiment. A dielectric encapsulation layer 152 may be formed on the structure 100.

The dielectric encapsulation layer 152 may be conformally formed on the structure 100, on an upper horizontal surface of the ILD 130, on an upper horizontal surface and vertical side surfaces of the top electrode 150 and on vertical side surfaces of the free layer 146, the tunneling barrier 142, the reference layer 140 and the bottom electrode 138. The dielectric encapsulation layer 152 may include materials such as, for example, any dielectric material such as silicon nitride (SiN) and silicon nitride carbon (SiNC) and may include a single layer or may include multiple layers of dielectric material. In an alternate embodiment, the metallic cap layer 152 may include zirconium oxide ($ZrO_2$). The dielectric encapsulation layer 152 may be deposited using typical deposition techniques, for example, physical vapor deposition, atomic layer deposition, molecular layer deposition, and chemical vapor deposition. The dielectric encapsulation layer 152 may have a thickness between 3 nm and 30 nm, although thickness greater than 30 nm or less than 3 nm are acceptable.

The dielectric encapsulation layer 152 helps to protect the free layer 146, the tunneling barrier 142, the reference layer 140 and the bottom electrode 138 from being damaged or oxidized during subsequent ILD materials deposition.

Figure 4:
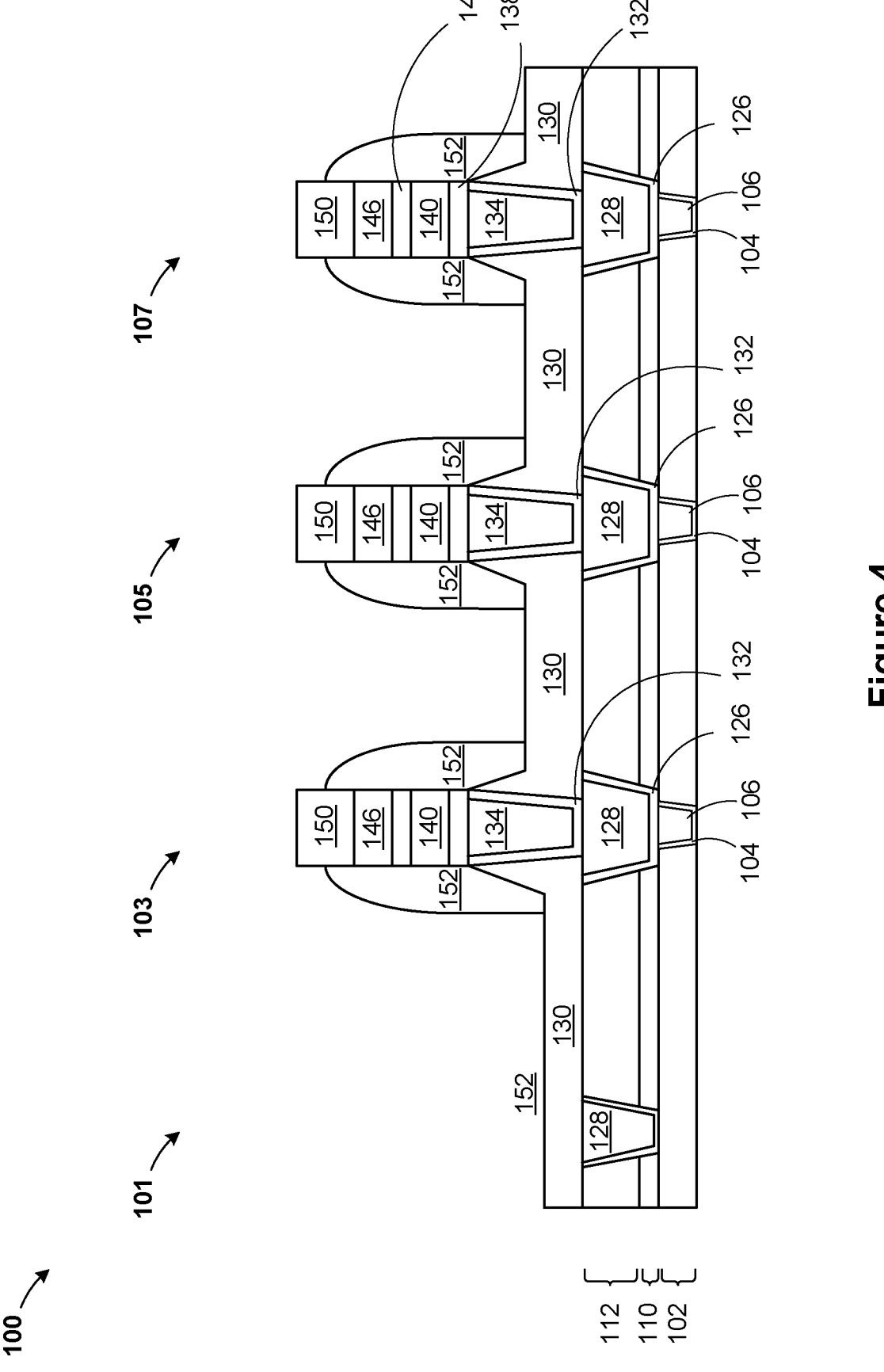
FIG. 4 illustrates a cross-sectional view of the semiconductor structure and illustrates patterning of the dielectric encapsulation layer, according to an exemplary embodiment.

Referring now to FIG. 4, a cross-sectional view of the structure 100 is shown, according to an embodiment. Portions of the dielectric encapsulation layer 152 may be removed.

The portions of the dielectric encapsulation layer 152 may be selectively removed using an anisotropic etching technique, such as, for example, reactive ion etching. The remaining portions of the dielectric encapsulation layer 152 may remain vertically aligned directly adjacent to the free layer 146, the tunneling barrier 142, the reference layer 140, the bottom electrode 138 and portions of the ILD 130 surrounding the bottom electrode, in the cells 103, 105, 107. The dielectric encapsulation layer 152 may be removed from a portion of the upper horizontal surfaces of the ILD 130. The dielectric encapsulation layer 152 may be removed in the cell 101.

Figure 5:
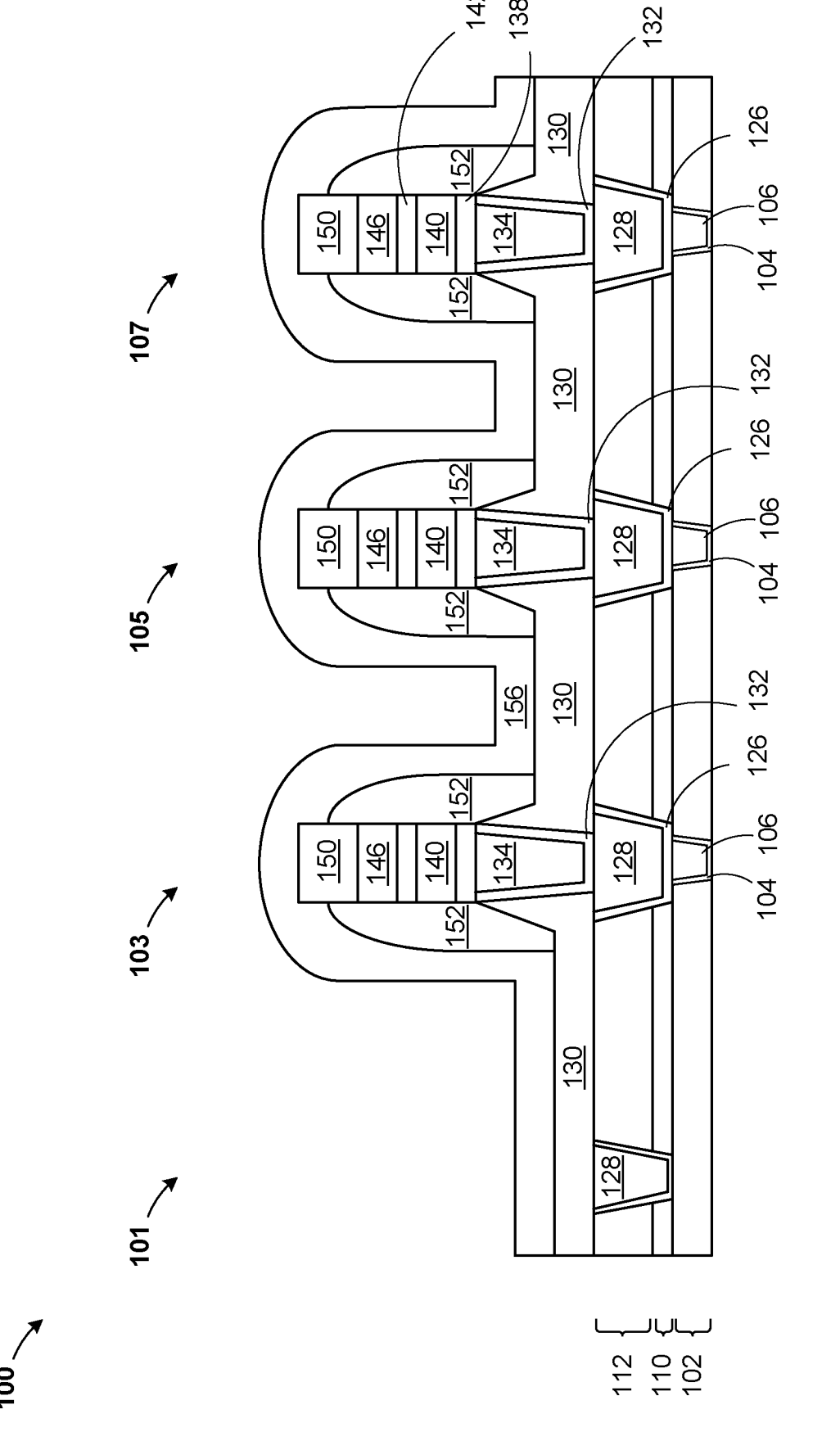
FIG. 5 illustrates a cross-sectional view of the semiconductor structure and illustrates formation of a metal spacer, according to an exemplary embodiment.

Referring now to FIG. 5, a cross-sectional view of the structure 100 is shown, according to an embodiment. A metal encapsulation layer 156 may be formed.

The metal encapsulation layer 156 may be conformally deposited on an upper horizontal surface and exposed portions of vertical side surfaces of the top electrode 150, on vertical side surfaces of the dielectric encapsulation layer 152 and on an upper horizontal surface of the ILD 130. The dielectric encapsulation layer 152 may be formed from a conductive material layer which is blanket deposited. The conductive material layer may include materials such as, for example titanium nitride (TiN), ruthenium (Ru), tungsten (W). The conductive material can be formed by for example, chemical vapor deposition (CVD), physical vapor deposition (PVD), and atomic layer deposition (ALD) or a combination thereof. The metal encapsulation layer 156 may be formed by damascene, or patterned from the conductive material layer, using known patterning and etching techniques.

The purpose of the metal encapsulation layer 156 is to provide protection to the dielectric encapsulation layer 152 during Mx+1 trench patterning and helps to obtain deeper trench depth by embedding the MRAM device within the metal layer.

Figure 6:
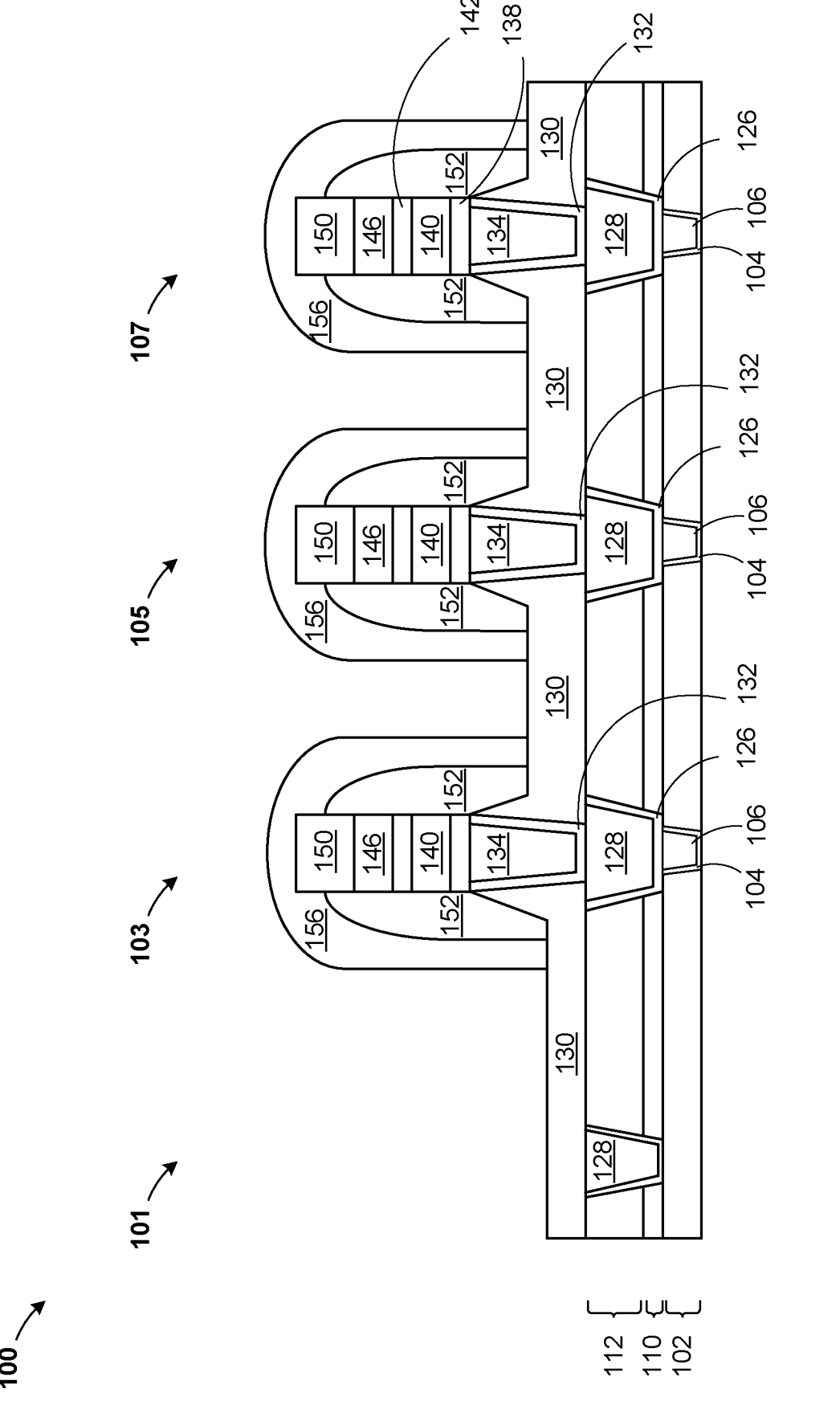
FIG. 6 illustrates a cross-sectional view of the semiconductor structure and illustrates patterning of the metal spacer, according to an exemplary embodiment.

Referring now to FIG. 6, a cross-sectional view of the structure 100 is shown, according to an embodiment. Portions of the metal encapsulation layer 156 may be selectively removed.

The portions of the metal encapsulation layer 156 may be removed using an anisotropic etching technique, such as, for example, reactive ion etching. The remaining portions of the metal encapsulation layer 156 may remain on the upper horizontal surface and exposed portions of vertical side surfaces of the top electrode 150, on vertical side surfaces of the dielectric encapsulation layer 152 and on a portion of an upper horizontal surface of the ILD 130. The metal encapsulation layer 156 may be removed from portions of the upper horizontal surface of the ILD 130.

Figure 7:
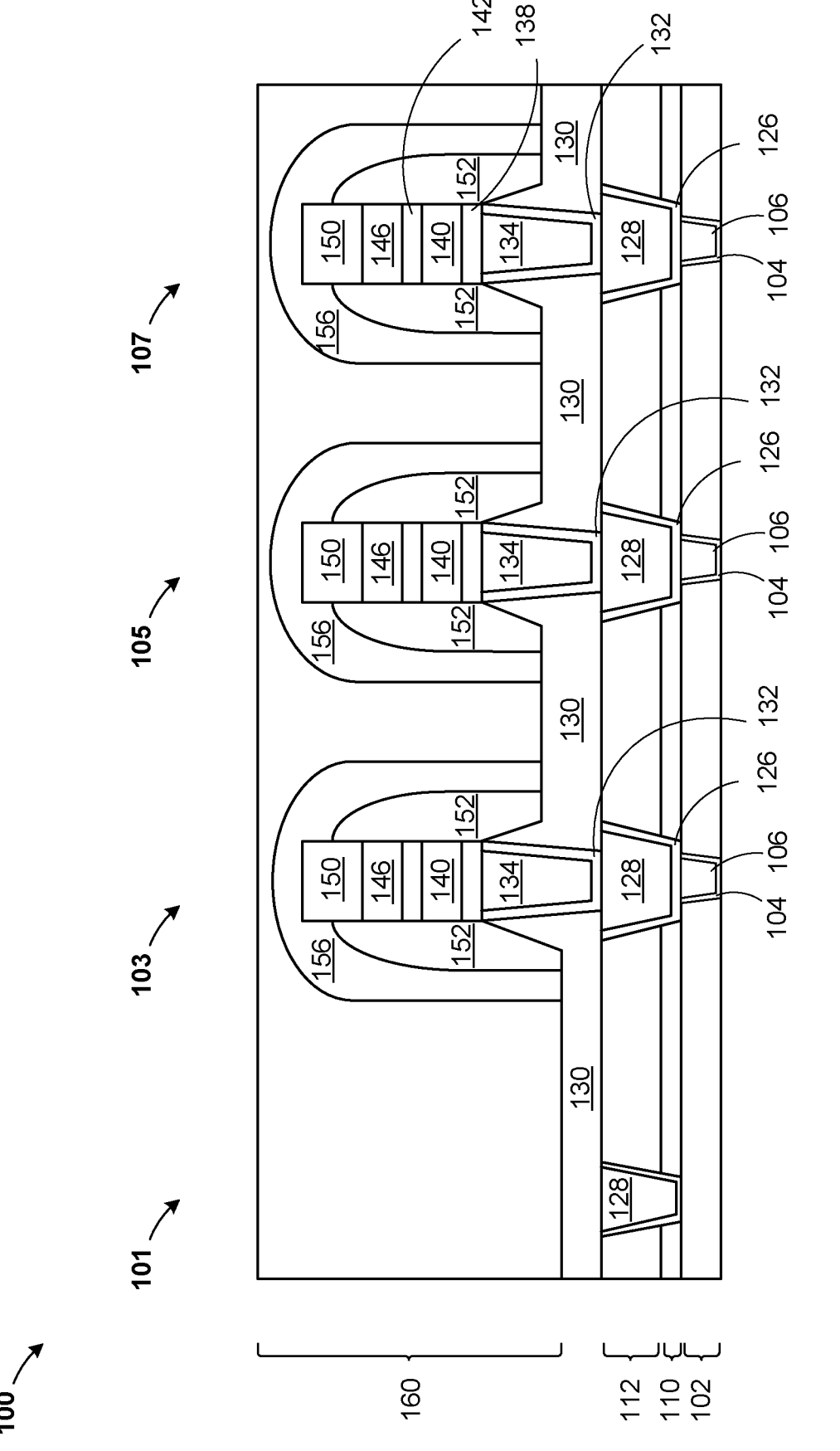
FIG. 7 illustrates a cross-sectional view of the semiconductor structure and illustrates formation of an inter-layer dielectric, according to an exemplary embodiment.

Referring now to FIG. 7, a cross-sectional view of the structure 100 is shown, according to an embodiment. An inter-layer dielectric (hereinafter "ILD") 160 may be formed.

The ILD 160 may be formed as described for the ILD 102, directly on upper horizontal and vertical side surfaces of the metal encapsulation layer 156, on upper horizontal and vertical side surfaces of the dielectric encapsulation layer 152 and an upper horizontal surface of the ILD 130. The ILD 160 helps to isolate the cells 103, 105, 107 from each other. A chemical mechanical polishing (CMP) or etch steps may be performed to provide a level upper surface of the ILD 160 and the metal encapsulation layer 156 for subsequent processing steps.

Figure 8:
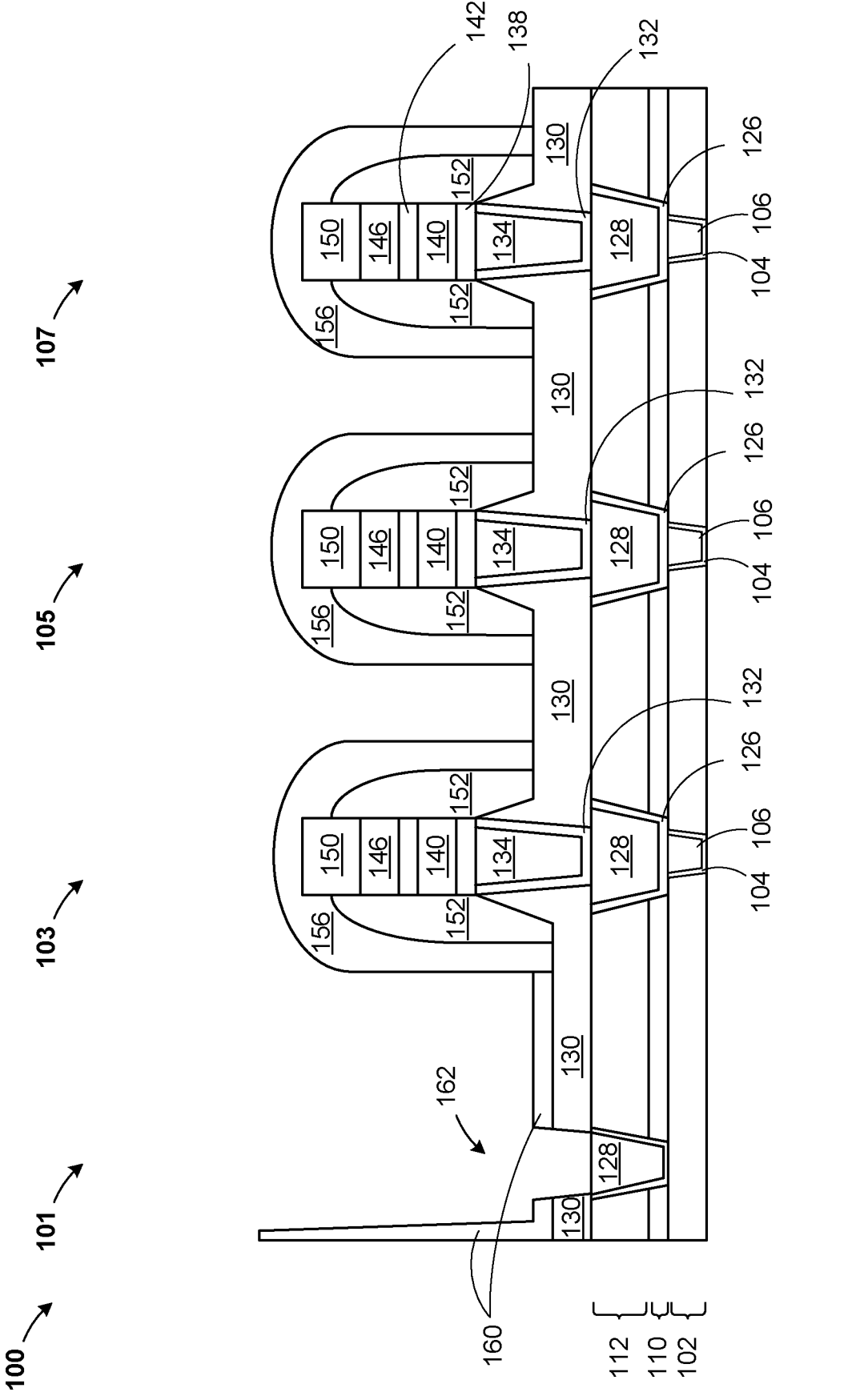
FIG. 8 illustrates a cross-sectional view of the semiconductor structure and illustrates patterning of the inter-layer dielectric, according to an exemplary embodiment.

Referring now to FIG. 8, a cross-sectional view of the structure 100 is shown, according to an embodiment. Portions of the ILD 160 and portions of the ILD 130 may be selectively removed, forming an opening 162.

The portions of the ILD 160 and the portions of the ILD 130 may be removed using known techniques of dry/wet etch processes.

In the cell 101, vertically aligned portions of the ILD 130 and of the ILD 160 may be removed, forming the opening 162 which exposes an upper horizontal portion of the lower metal wire 128 in the cell 101.

In the cells 103, 105, 107, the ILD 160 may be removed, exposing upper horizontal portions of the ILD 130. Vertical side surfaces and upper horizontal surfaces of the metal encapsulation layer 156 may be exposed surrounding each MTJ stack in each cell 103, 105, 107. The metal encapsulation layer 156 protects the MTJ stack in the cells 103, 105, 107, during removal of the portions of the ILD 160 and the ILD 130.

Figure 9:
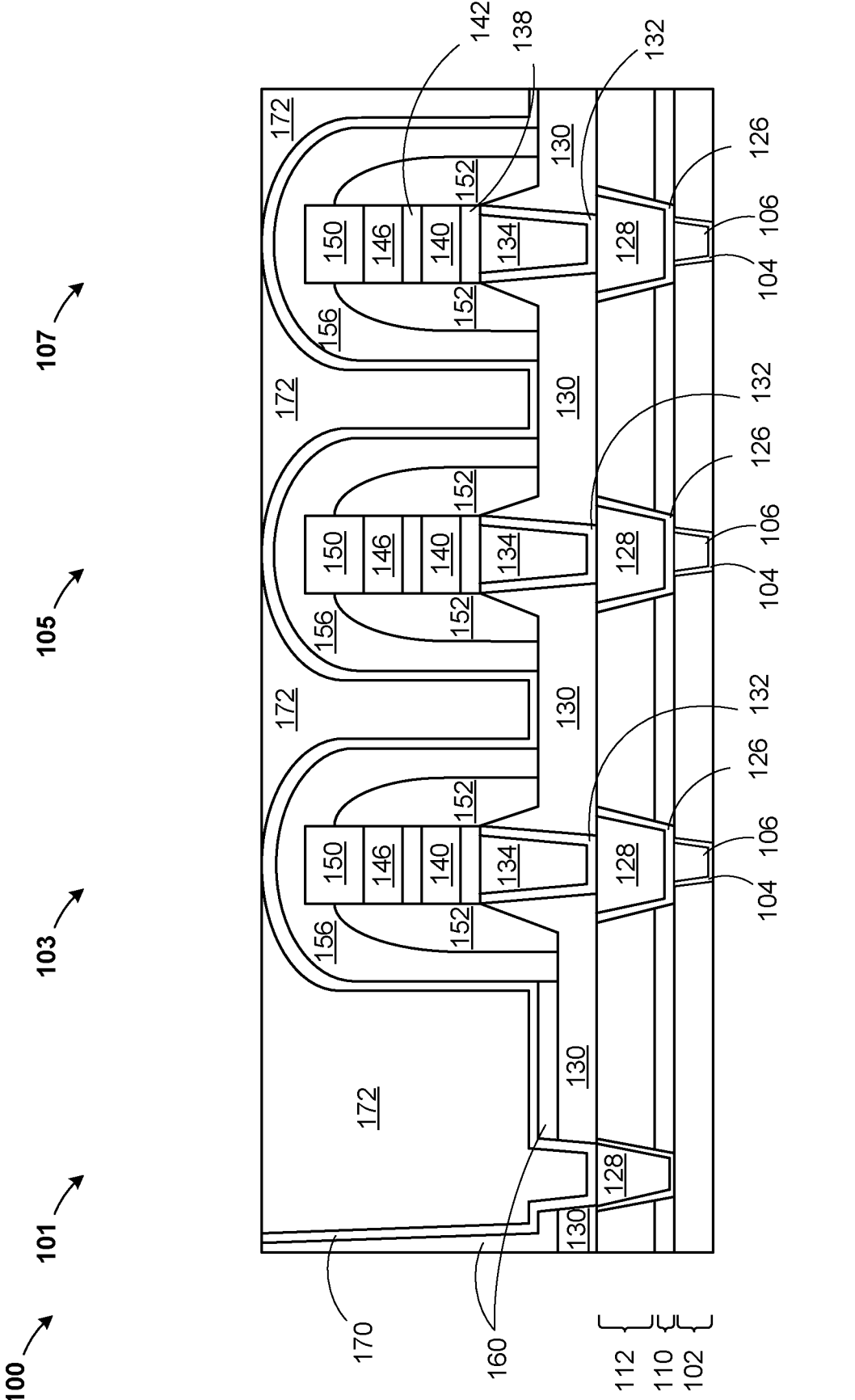
FIG. 9 illustrates a cross-sectional view of the semiconductor structure and illustrates formation of a liner and metal fill, according to an exemplary embodiment.

Referring now to FIG. 9, a cross-sectional view of the structure 100 is shown, according to an embodiment. A liner 170 and a metal fill 172 may be formed.

The liner 170 may be formed as described for the liner 126. The liner 170 may be formed on vertical side surfaces and horizontal upper surfaces of the ILD 160 and of the ILD 130, on vertical side surfaces and horizontal upper surfaces of the metal encapsulation layer 156 and on an upper horizontal surface of the lower metal wire 128 in the cell 101. The liner 170 may partially fill the opening 162.

The metal fill 172 may be formed as described for the lower metal wire 128. The metal fill 172 may fill remaining portions of the opening 162 and surround each of the MTJ stacks in the cells 103, 105, 107.

A planarization process, such as, for example, chemical mechanical polishing (CMP), may be done to remove excess material from an upper horizontal surface of the structure 100 such that upper horizontal surfaces of the metal fill 172, the liner 170, and the ILD 160 are coplanar.

Figure 10:
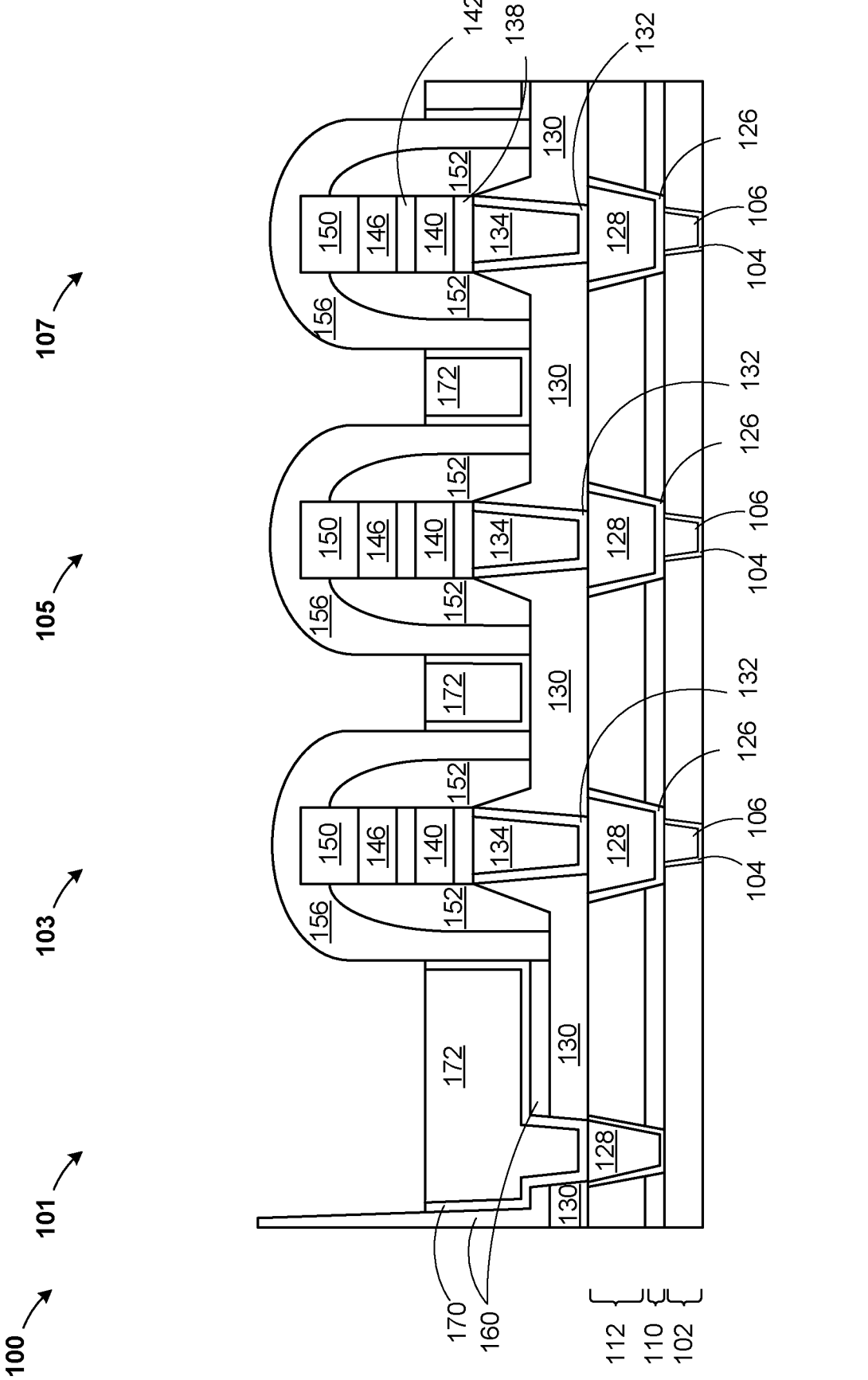
FIG. 10 illustrates a cross-sectional view of the semiconductor structure and illustrates removal of portions of the liner and the metal fill, according to an exemplary embodiment.

Referring now to FIG. 10, a cross-sectional view of the structure 100 is shown, according to an embodiment. The liner 170 and the metal fill 172 may be partially removed.

The portions of the liner 170 and the metal fill 172 may be selectively removed, selective to the ILD 160 and the metal encapsulation layer 156, using a combination of wet/dry etch processes.

Figure 11:
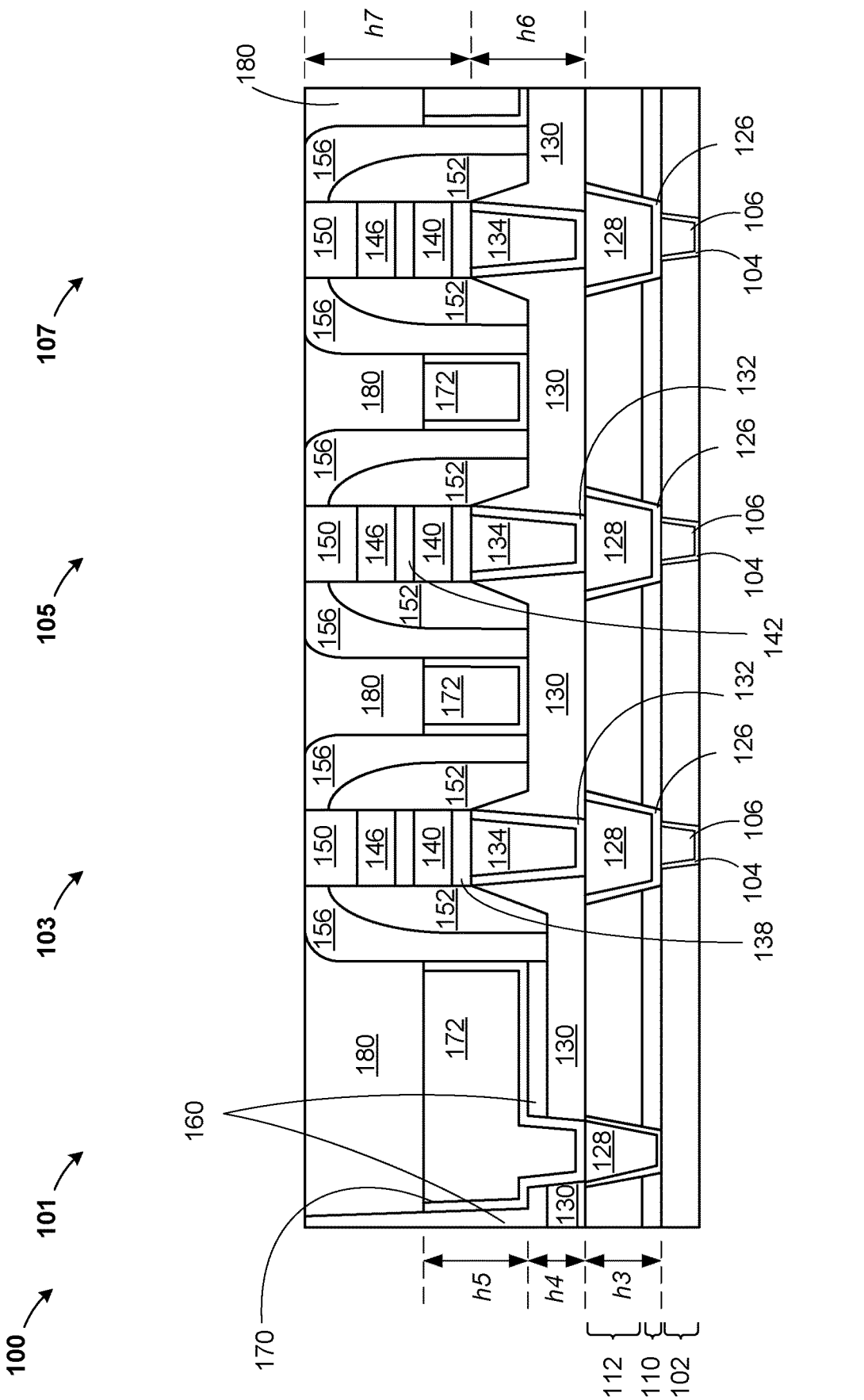
FIG. 11 illustrates a cross-sectional view of the semiconductor structure and illustrates formation of an inter-layer dielectric, according to an exemplary embodiment.

Referring now to FIG. 11, a cross-sectional view of the structure 100 is shown, according to an embodiment. An inter-layer dielectric (hereinafter "ILD") 180 may be formed.

The ILD 180 may be formed as described for the ILD 102. The ILD 180 may be formed on upper horizontal surfaces of the liner 170 and the metal fill 172. The ILD 180 may be formed on exposed upper horizontal surfaces and vertical side surfaces of the metal encapsulation layer 156. A chemical mechanical polishing (CMP) or etch steps may be performed on the structure 100, exposing upper horizontal surfaces of the ILD 180, the metal encapsulation layer 156, the top electrode 150 and the ILD 160.

A planarization process, such as, for example, chemical mechanical polishing (CMP), may be done to remove excess material from an upper horizontal surface of the structure 100 such that upper horizontal surfaces of the metal fill 172, the liner 170, the metal encapsulation layer 156 and the top electrode 150 are coplanar. The metal encapsulation layer 156 can serve as a stop layer during the planarization process.

The resulting structure 100 has a bilayer top electrode, which includes the top electrode 150 and the metal encapsulation layer 156. The metal encapsulation layer 156 surrounds the MRAM pillar. The metal encapsulation layer 156 contacts the metal fill 172 of the Mx+1 word line, or the upper word line.

The MRAM device has a vertical height which is greater than a vertical height of the Mx+1 metal line height.

A height of the Mx line is h3. The Mx line is the bit line or word line below the MRAM device. A height of the Vx via is h4. The Vx via is a connection between the Mx line and the Mx+1 line. A height of the Mx+1 line is h5. The Mx+1 line is a word line or a bit line above the MRAM device. A height of the bottom electrode contact 134 is h6. A height of the MRAM pillar is h7. The height of the MRAM pillar, h7, plus the height of the bottom electrode contact 134, h6, is h7+h6, which is the height of the MRAM structure. The height of the MRAM structure is greater than a height of the Vx via, h3, plus a height of the Mx+1 line, h5. An upper surface of the MRAM device, or an upper surface of the top electrode 150, is above an upper surface of the Mx+1 line, or an upper surface of the metal fill 172.

The metal fill 172 of the Mx+1 line has a lower horizontal surface below an upper horizontal surface of the bottom electrode contact 134. The metal fill 172 wraps around the entire MTJ pillar surrounding the dielectric encapsulation layer 152 and the metal encapsulation layer 156. This invention enables fitting of a taller MRAM structure into narrow intermetal dielectric spacing, thus extending the usage of MRAM into more advanced node technologies.

This invention describes a structure with the MRAM device embedded into an Mx+1 metal line itself, and the MRAM device extending to a height above an upper surface of the Mx+1 metal line. The new structure has an upper electrode contact which wraps around the MRAM structure. The Mx+1 line contacts the wrap around upper electrode contact at a height below an upper surface of the MRAM device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a magnetic tunnel junction (MTJ) stack; and
a dielectric encapsulation layer surrounding vertical side surfaces of the MTJ stack;
a metallic encapsulation layer surrounding the dielectric encapsulation layer, wherein the metallic encapsulation layer is electrically and physically connected to a top electrode of the MTJ stack.

2. The semiconductor device according to claim 1, wherein
a lower horizontal surface of the metallic encapsulation layer is below a bottom electrode of the MTJ stack.

3. The semiconductor device according to claim 1, wherein the MTJ stack comprises:
the top electrode, a free layer, a tunneling barrier, a reference layer and a bottom electrode.

4. The semiconductor device according to claim 1, wherein an upper word line of the MTJ stack comprises an upper horizontal surface below a lower horizontal surface of the top electrode.

5. The semiconductor device according to claim 1, wherein an upper word line of the MTJ stack comprises an upper horizontal surface below a lower horizontal surface of a bottom electrode of the MTJ stack.

6. A semiconductor device comprising:
a magnetic tunnel junction (MTJ) stack;
a dielectric encapsulation layer surrounding vertical side surfaces of the MTJ stack; and
a metallic encapsulation layer surrounding the dielectric encapsulation layer, wherein the metallic encapsulation layer is electrically and physically connected to a top electrode of the MTJ stack, and wherein a lower horizontal surface of the metallic encapsulation layer is below a bottom electrode contact of the MTJ stack.

7. The semiconductor device according to claim 6, wherein the MTJ stack comprises:
the top electrode, a free layer, a tunneling barrier, a reference layer and a bottom electrode.

8. The semiconductor device according to claim 6, wherein an upper word line of the MTJ stack comprises an upper horizontal surface below a lower horizontal surface of the top electrode.

9. A method comprising:
forming a magnetic tunnel junction (MTJ) stack; and
forming a dielectric encapsulation layer surrounding vertical side surfaces of the MTJ stack,
forming a metallic encapsulation layer surrounding the dielectric encapsulation layer, wherein the metallic encapsulation layer is electrically and physically connected to a top electrode of the MTJ stack.

10. The method according to claim 9, wherein
a lower horizontal surface of the metallic encapsulation layer is below a bottom electrode of the MTJ stack.

11. The method according to claim 9, wherein the MTJ stack comprises:
a top electrode, a free layer, a tunneling barrier and a reference layer.

12. The method according to claim 9, wherein an upper word line of the MTJ stack comprises an upper horizontal surface below a lower horizontal surface of the top electrode.

13. The method according to claim 9, wherein an upper word line of the MTJ stack comprises an upper horizontal surface below a lower horizontal surface of a bottom electrode.

14. The method according to claim 9, further comprising:
forming a dielectric surrounding the MTJ stack.

15. The method according to claim 9, further comprising:
forming an upper word line of the MTJ stack, wherein the upper word line surrounds vertical size surfaces of the MTJ stack.

16. The method according to claim 15, further comprising:
removing a portion of the upper word line.

17. The method according to claim 16, further comprising:
forming an inter-layer dielectric above the upper word line surrounding exposed portions of the metallic encapsulation layer.

* * * * *